(12) United States Patent
Hayakawa

(10) Patent No.: US 9,941,582 B2
(45) Date of Patent: Apr. 10, 2018

(54) SWITCH MODULE, FRONT-END MODULE, AND DRIVING METHOD FOR SWITCH MODULE

(71) Applicant: Murata Manufacturing Co., Ltd., Nagaokakyo-shi, Kyoto-fu (JP)

(72) Inventor: Masashi Hayakawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 74 days.

(21) Appl. No.: 15/229,227

(22) Filed: Aug. 5, 2016

(65) Prior Publication Data

US 2017/0048859 A1 Feb. 16, 2017

(30) Foreign Application Priority Data

Aug. 10, 2015 (JP) .................................. 2015-158312
May 10, 2016 (JP) .................................. 2016-094945

(51) Int. Cl.
*H04L 5/00* (2006.01)
*H01Q 1/48* (2006.01)
*H04B 1/04* (2006.01)

(52) U.S. Cl.
CPC .............. *H01Q 1/48* (2013.01); *H04L 5/001* (2013.01); *H04B 2001/0408* (2013.01)

(58) Field of Classification Search
CPC ... H01Q 1/48; H04L 5/001; H04B 2001/0408
See application file for complete search history.

(56) References Cited

U.S. PATENT DOCUMENTS

| 9,363,822 B1* | 6/2016 | Oroskar ................ H04W 72/04 |
| 2011/0312366 A1* | 12/2011 | Yang .................... H04W 52/365 455/522 |
| 2014/0321312 A1 | 10/2014 | Narahashi et al. |
| 2016/0049986 A1* | 2/2016 | Cho ...................... H04L 5/1461 370/278 |

FOREIGN PATENT DOCUMENTS

| JP | 2014-017750 A | 1/2014 |
| WO | 2014/189990 A1 | 11/2014 |

\* cited by examiner

*Primary Examiner* — Mohammad S Anwar
(74) *Attorney, Agent, or Firm* — Keating & Bennett, LLP

(57) ABSTRACT

A switch module selects one of a CA mode in which first and second frequency bands are used simultaneously and a non-CA mode in which only one of the first and second frequency bands is used. The switch module includes a first signal path propagating the first frequency band therethrough, a second signal path propagating the second frequency band therethrough, a third signal path simultaneously propagating the first and second frequency bands therethrough, a switch circuit, and a variable adjuster. The switch circuit switches the connection between an antenna device and one of the three signal paths. The variable adjuster adjusts a variable matching circuit for the third signal path when the non-CA mode is selected or adjusts a variable matching circuit for the first signal path or that for the second signal path when the CA mode is selected.

17 Claims, 9 Drawing Sheets

CA

NON-CA
(MIDDLE BAND)

NON-CA
(HIGH BAND)

NON-CA MIDDLE BAND CONNECTION

Freq (0.1 GHz to 4.0 GHz)

Freq (0.1 GHz to 4.0 GHz)

SWITCH 202B IS ON (SHORT)

SWITCH 202B IS OFF (OPEN)

SWITCH 202B IS ON (SHORT)

SWITCH 202B IS OFF (OPEN)

SWITCH MODULE, FRONT-END MODULE, AND DRIVING METHOD FOR SWITCH MODULE

CROSS REFERENCE TO RELATED APPLICATIONS

This application claims the benefit of priority to Japanese Patent Application 2016-094945 filed May 10, 2016 and Japanese Patent Application 2015-158312 filed Aug. 10, 2015, the entire contents of each application are hereby incorporated herein by reference.

BACKGROUND OF THE INVENTION

1. Field of the Invention

The present invention relates to a switch module and a front-end module preferably for use in wireless communication, and to a driving method for the switch module.

2. Description of the Related Art

In order to support the international roaming services and to improve the communication speed, there is an increasing demand for multiband- and multimode-support cellular phones in which a single cellular phone terminal is capable of handling multiple frequency bands and multiple wireless systems.

Japanese Unexamined Patent Application Publication No. 2014-17750 discloses a carrier aggregation (CA)-support front-end circuit. This front-end circuit includes a 1-input n-output sPnT (single-Pole n-Throw) switch which connects a single common terminal with two or more selection terminals at the same time, a variable impedance adjusting circuit connected to a stage subsequent to the sPnT switch, and a duplexer connected to a stage subsequent to the variable impedance adjusting circuit. Japanese Unexamined Patent Application Publication No. 2014-17750 describes that, with the configuration of this front-end circuit, even if different frequency bands are used at the same time, a leakage of a signal into another circuit can be prevented.

However, in order to respond to all sorts of communication environments including multiband and multimode environments, it is necessary to consider, not only the communication quality of CA mode communication, but also that of single-band or single-mode communication, that is, so-called non-CA mode communication. In the front-end circuit disclosed in Japanese Unexamined Patent Application Publication No. 2014-17750, impedance adjustment is made to two frequency bands used at the same time in the CA mode, but impedance adjustment is not performed when the non-CA mode is used. That is, neither of impedance adjustment to a signal path for the non-CA mode while the front-end circuit is being operated in the CA mode nor impedance adjustment to a signal path for the CA mode while the front-end circuit is being operated in the non-CA mode is performed. In a CA-support front-end circuit, such as that disclosed in Japanese Unexamined Patent Application Publication No. 2014-17750, plural signal paths are connected to a switch. Accordingly, particularly when the front-end circuit is operated in the non-CA mode, impedance mismatching is likely to occur due to parasitic components generated within the switch, which leads to an increase in the signal loss. As a result, the bandpass characteristic is decreased.

SUMMARY OF THE INVENTION

Preferred embodiments of the present invention provide switch modules, front-end modules, and driving methods for the switch modules in which it is possible to reduce the signal propagation loss in a system in which one of a CA mode and a non-CA mode is selectable.

According to a preferred embodiment of the present invention, a switch module which is capable of selecting one of a CA mode and a non-CA mode. The CA mode is a mode in which a first frequency band for wireless communication and a second frequency band for wireless communication are used simultaneously. A frequency band of the second frequency band is different from a frequency band of the first frequency band. The non-CA mode is a mode in which only one of the first frequency band and the second frequency band is used. The switch module includes first, second, and third signal paths and a switch circuit. The first signal path is used to propagate a signal of the first frequency band. The second signal path is used to propagate a signal of the second frequency band. The third signal path is used to simultaneously propagate a signal of the first frequency band and a signal of the second frequency band. The switch circuit includes a common terminal connected to an antenna device, a first selection terminal connected to a first end of the first signal path, a second selection terminal connected to a first end of the second signal path, and a third selection terminal connected to a first end of the third signal path. The switch circuit exclusively switches the connection between the common terminal and one of the first through third selection terminals. The switch circuit includes a first variable matching circuit disposed between the first selection terminal and a ground terminal, a second variable matching circuit disposed between the second selection terminal and a ground terminal, and a third variable matching circuit disposed between the third selection terminal and a ground terminal. The switch module further includes a variable adjuster that variably adjusts the third variable matching circuit in a case in which the non-CA mode is selected or that variably adjusts at least one of the first and second variable matching circuits in a case in which the CA mode is selected.

With this arrangement, in a configuration in which different signal paths are provided for the CA mode and the non-CA mode, the variable adjuster adjusts, not only the impedance of a signal path which is being used for wireless communication, but also the impedance of a signal path which is not being used for wireless communication. It is thus possible to enhance the isolation between a signal path which is being used for wireless communication and a signal path which is not being used for wireless communication, and also to considerably reduce or prevent the occurrence of impedance mismatching in a signal path which is being used for wireless communication.

The variable adjuster may make impedance of the third variable matching circuit vary in accordance with whether the first frequency band or the second frequency band is selected in the non-CA mode.

With this arrangement, even for the use of the same non-CA mode, the variable adjuster makes the impedance of the signal path for the CA mode vary in accordance with the frequency band to be selected in the non-CA mode. It is thus possible to highly precisely perform impedance matching, particularly in the non-CA mode, in accordance with the frequency band to be selected.

The switch circuit may further include a first switch that switches a state between the first selection terminal and the common terminal to a conducting state or a non-conducting state, a second switch that switches a state between the second selection terminal and the common terminal to a conducting state or a non-conducting state, and a third switch that switches a state between the third selection terminal and the common terminal to a conducting state or a non-conducting state. The third variable matching circuit may be a third shunt switch that switches a state between the third selection terminal and a ground terminal to a conducting state or a non-conducting state. The variable adjuster may switch the third shunt switch to a non-conducting state in a case in which the first frequency band in the non-CA mode is selected, and switches the third shunt switch to a conducting state in a case in which the second frequency band in the non-CA mode is selected.

The second frequency band may be a frequency band assigned to a higher frequency range than a frequency range of the first frequency band.

With the above-described configuration, when the second frequency band in the non-CA mode is selected, the third signal path is shunted by the third shunt switch. Accordingly, the first end of the third signal path is in the short state. In contrast, when the first frequency band in the non-CA mode is selected, since the third shunt switch is in the non-conducting state, the first end of the third signal path is in the open state. In this manner, the impedance of the third signal path, which is not being used, is adjusted in accordance with the selected signal band. It is thus possible to enhance the isolation between the first or second signal path which is being used and the third signal path, and also to considerably reduce or prevent the occurrence of impedance mismatching in the first signal path or the second signal path which is being used.

The third signal path may include a first path that selectively passes the first frequency band therethrough and a second path that selectively passes the second frequency band therethrough. The first end of the third signal path may be a node at which a first end of the first path and a first end of the second path are connected to each other. The switch module may further include a fourth switch that switches a state between a second end of the first path and the first signal path to a conducting state or a non-conducting state, and a fifth switch that switches a state between a second end of the second path and the second signal path to a conducting state or a non-conducting state. The variable adjuster may switch the fourth switch to a non-conducting state in a case in which the first frequency band in the non-CA mode is selected, and may switch the fifth switch to a non-conducting state in a case in which the second frequency band in the non-CA mode is selected.

When the first frequency band in the non-CA mode is selected, the first path of the third signal path acts as a load impedance for the first signal path via the fourth switch which becomes capacitive. When the second frequency band in the non-CA mode is selected, the second path of the third signal path acts as a load impedance for the second signal path via the fifth switch which becomes capacitive. Even in this case, the impedance of the third signal path, which is not being used but is still a load, is individually adjusted in accordance with the pass band of the selected frequency band. It is thus possible to enhance the isolation between the first signal path or the second signal path which is being used and the third signal path and also to considerably reduce or prevent the occurrence of impedance mismatching in the first signal path or the second signal path which is being used for wireless communication.

According to another preferred embodiment of the present invention, a front-end module including the above-described switch module and a duplexer device connected to a second end of the first signal path or a second end of the second signal path.

The front-end module may further include a power amplifier device connected to a transmit terminal of the duplexer device.

The front-end module may further include a low-noise amplifier connected to a receive terminal of the duplexer device.

With the above-described configuration, it is possible to provide a front-end module in which the signal propagation loss is significantly reduced or prevented in a system in which one of the CA mode and the non-CA mode is selectable.

According to a further preferred embodiment of the present invention, a driving method for the above-described switch module includes variably adjusting the third variable matching circuit in a case in which the non-CA mode is selected or variably adjusting at least one of the first and second variable matching circuits in a case in which the CA mode is selected.

With the above-described method, it is possible to reduce the signal propagation loss in the switch module which is capable of selecting one of the CA mode and the non-CA mode.

With the switch modules according to preferred embodiments of the present invention, it is possible to reduce the signal propagation loss in a system in which one of the CA mode and the non-CA mode is selectable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
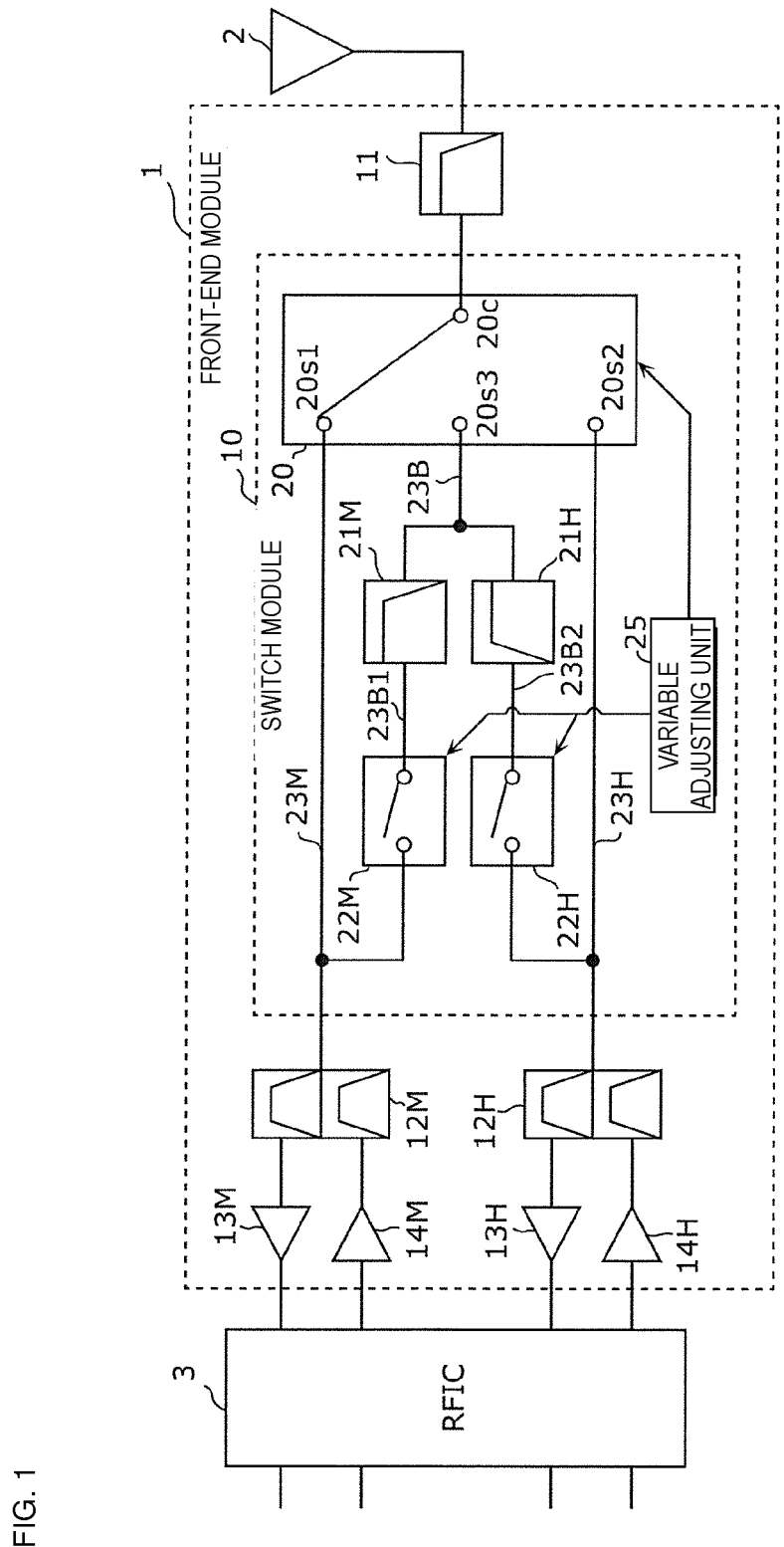
FIG. 1 is a circuit diagram illustrating a front-end module according to a preferred embodiment of the present invention and peripheral circuits disposed near the front-end module.

Preferred embodiments of the present invention will be described below in detail with reference to the accompanying drawings. All of the preferred embodiments described below illustrate general or specific examples. Numeric values, configurations, materials, components, and positions and connection states thereof illustrated in the following preferred embodiments are only examples, and do not limit the present invention. Among the components illustrated in the following preferred embodiments, the components that are not recited in the independent claims which embody the broadest concept of various preferred embodiments of the present invention will be described as optional components. The sizes and dimensional ratios of the components in the drawings are not necessarily illustrated as actual sizes and ratios.

FIG. 1 is a circuit diagram illustrating a front-end module 1 according to a preferred embodiment of the present invention and peripheral circuits disposed near the front-end module 1. In FIG. 1, the front-end module 1, an antenna device 2, and a radio frequency (RF) signal processing circuit (radio-frequency integrated circuit (RFIC)) 3 are shown. The front-end module 1, the antenna device 2, and the RF signal processing circuit 3 are disposed in a front-end portion of a multiband- and multimode-support cellular phone, for example.

The front-end module 1 includes a low pass filter 11, a switch module 10, duplexers 12M and 12H, low-noise amplifiers 13M and 13H, and power amplifiers 14M and 14H.

With the above-described configuration, the front-end module 1 is able to define and function as a RF front-end circuit for wireless communication which is capable of selecting one of a CA mode and a non-CA mode.

The switch module 10 is a RF switch module which switches the connection between one of signal paths and the antenna device 2. In the signal paths, a signal of at least one frequency band selected from multiple frequency bands is propagated. In the switch module 10, in order to support multiband and multimode communication, plural signal paths are provided to transmit and receive wireless signals by using multiple frequency bands as carrier waves. The switch module 10 includes a switch circuit 20, a first signal path 23M, a second signal path 23H, a third signal path 23B, a low pass filter 21M, a high pass filer 21H, CA switch circuits 22M and 22H, and a variable adjuster 25.

In the first signal path 23M, a frequency division duplex (FDD) signal of a first frequency band is selectively propagated. An example of the first frequency band is LTE-standard Band4 (transmit band: 1710 MHz to 1755 MHz, receive band: 2110 MHz to 2155 MHz).

In the second signal path 23H, a FDD signal of a second frequency band, which is higher than the first frequency band, is selectively propagated. An example of the second frequency band is LTE-standard Band7 (transmit band: 2500 MHz to 2570 MHz, receive band: 2620 MHz to 2690 MHz).

In the third signal path 23B, a FDD signal of the first frequency band and a FDD signal of the second frequency band are propagated at the same time. The third signal path 23B includes a first path 23B1 in which a FDD signal of the first frequency band is selectively propagated and a second path 23B2 in which a FDD signal of the second frequency band is selectively propagated. In the first path 23B1, the low pass filter 21M and the CA switch circuit 22M are disposed. In the second path 23B2, the high pass filter 21H and the CA switch circuit 22H are disposed.

Signals propagating within the first signal path 23M, the second signal path 23H, and the third signal path 23B are not restricted to FDD signals, but may be signals of another division duplex system. In this case, the duplexers 12M and 12H respectively connected to the first signal path 23M and the second signal path 23H may be RF switches.

The switch circuit 20 includes a common terminal 20c and first, second, and third selection terminals 20s1, 20s2, and 20s3. The common terminal 20c is connected to the antenna device 2 via the low pass filter 11. The first selection terminal 20s1 is connected to a first end of the first signal path 23M. The second selection terminal 20s2 is connected to a first end of the second signal path 23H. The third selection terminal 20s3 is connected to a first end of the third signal path 23B. The switch circuit 20 exclusively switches the connection between the common terminal 20c and one of the first through third selection terminals 20s1 through 20s3, thus connecting the antenna device 2 and one of the first, second, and third signal paths 23M, 23H, and 23B.

The third selection terminal 20s3 is connected to the first end of the third signal path 23B, as stated above. More specifically, the third selection terminal 20s3 is connected to a first end of the first path 23B1 and a first end of the second path 23B2. A second end of the first path 23B1 is connected to the first signal path 23M via the CA switch circuit 22M. A second end of the second path 23B2 is connected to the second signal path 23H via the CA switch circuit 22H.

The variable adjuster 25 is a controller which adjusts the circuit states of the switch circuit 20 and the CA switch circuits 22M and 22H, based on selection information indicating which one of the CA mode and the non-CA mode has been selected. The variable adjuster 25 may obtain the selection information from the switch circuit 20 or the RF signal processing circuit 3 connected to the stage subsequent to the front-end module 1. The operation of the variable adjuster 25 will be discussed later.

In the front-end module 1, for the purpose of improving the communication quality, different frequency bands are used at the same time, that is, the so-called CA system is used. In the CA system, one of the non-CA mode and the CA mode is selectable. In the non-CA mode, only a single frequency band is used. In the CA mode, different frequency bands are used at the same time. Which one of the modes is selected is dependent on the situation of the radio wave usage.

Figure 2A:
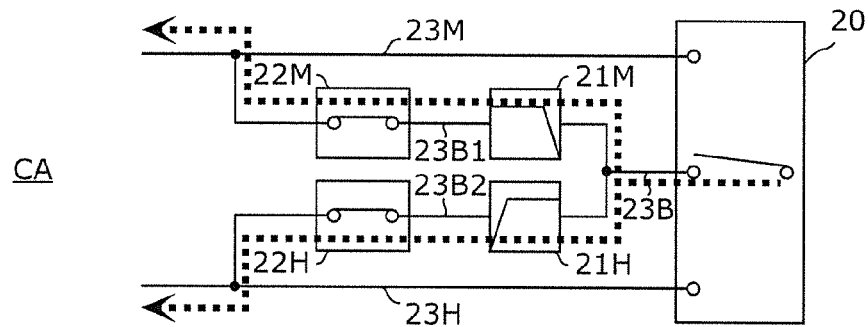
FIG. 2A is a circuit state diagram of a switch module according to a preferred embodiment of the present invention when a CA mode is selected.

FIG. 2A is a circuit state diagram of the switch module 10 when the CA mode is selected. As shown in FIG. 2A, when the CA mode is selected in the switch module 10, the switch circuit 20 connects the third signal path 23B with the antenna device 2. The first and second signal paths 23M and 23H are not connected to the antenna device 2. With this connection state, in the CA mode, a signal of the first frequency band is propagated in the first path 23B1, and at the same time, a signal of the second frequency band is propagated in the second path 23B2.

Figure 2B:
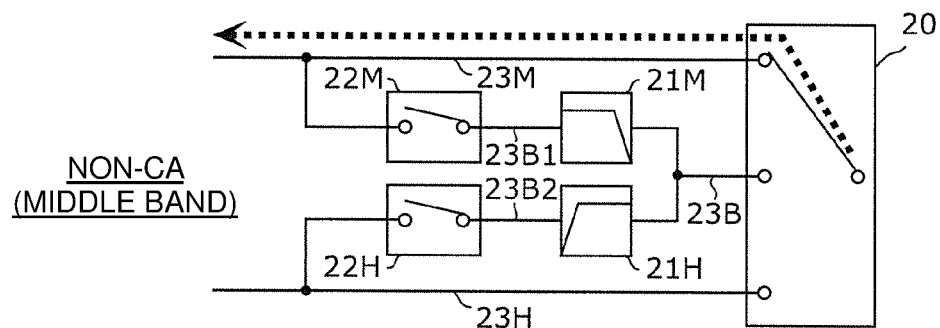
FIG. 2B is a circuit state diagram of the switch module when a non-CA mode (middle band) is selected.

FIG. 2B is a circuit state diagram of the switch module 10 when the first frequency band (middle band) in the non-CA mode is selected. As shown in FIG. 2B, when the non-CA mode (middle band) is selected, the switch circuit 20 connects the first signal path 23M with the antenna device 2. The second and third signal paths 23H and 23B are not connected to the antenna device 2. With this connection state, in the non-CA mode (middle band), a signal of the first frequency band is propagated in the first signal path 23M.

Figure 2C:
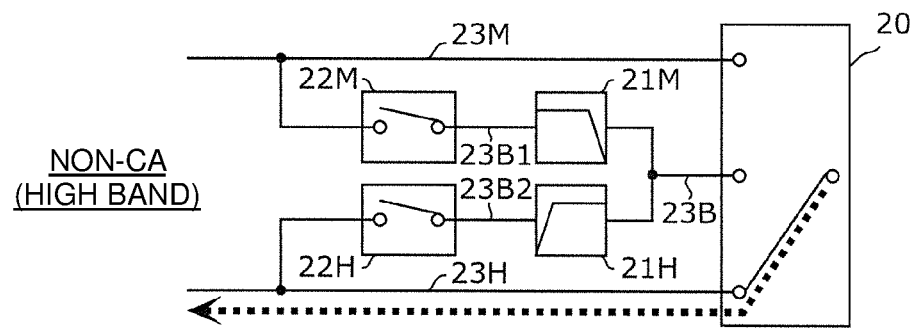
FIG. 2C is a circuit state diagram of the switch module when a non-CA mode (high band) is selected.

FIG. 2C is a circuit state diagram of the switch module 10 when the second frequency band (high band) in the non-CA mode is selected. As shown in FIG. 2C, when the non-CA mode (high band) is selected, the switch circuit 20 connects the second signal path 23H with the antenna device 2. The first and third signal paths 23M and 23B are not connected to the antenna device 2. With this connection state, in the non-CA mode (high band), a signal of the second frequency band is propagated in the second signal path 23H.

The circuit configurations of the switch circuit 20 and the CA switch circuits 22M and 22H will be described below.

Figure 3A:
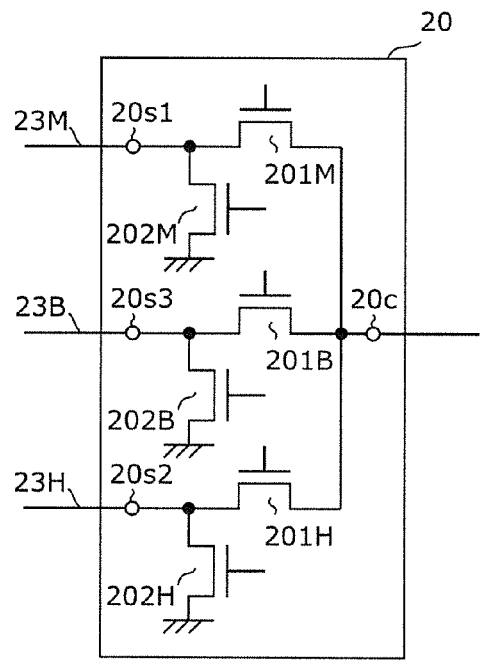
FIG. 3A is a circuit diagram illustrating the configuration of the switch circuit.

FIG. 3A is a circuit diagram illustrating the configuration of the switch circuit 20. As shown in FIG. 3A, the switch circuit 20 includes six field effect transistors (FETs) 201M, 201B, 201H, 202M, 202B, and 202H. In each of the FETs, the state between the source and the drain is switched to the conducting state or the non-conducting state according to a control signal supplied to the gate.

The variable adjuster 25 supplies this control signal to the gates of the six FETs 201M, 201B, 201H, 202M, 202B, and 202H so as to adjust the circuit state of the switch circuit 20.

The FETs 201M and 202M are switches that change the connection state between the first signal path 23M and the antenna device 2. The FET 201M is a first switch that switches the state between the common terminal 20c and the first selection terminal 20s1 to the conducting state or the non-conducting state. The FET 202M is a first shunt switch that switches the state between the first selection terminal 20s1 and a ground terminal to the conducting state or the non-conducting state.

The FETs 201H and 202H are switches that change the connection state between the second signal path 23H and the antenna device 2. The FET 201H is a second switch that switches the state between the common terminal 20c and the second selection terminal 20s2 to the conducting state or the non-conducting state. The FET 202H is a second shunt switch that switches the state between the second selection terminal 20s2 and a ground terminal to the conducting state or the non-conducting state.

The FETs 201B and 202B are switches that change the connection state between the third signal path 23B and the antenna device 2. The FET 201B is a third switch that switches the state between the common terminal 20c and the third selection terminal 20s3 to the conducting state or the non-conducting state. The FET 202B is a third shunt switch that switches the state between the third selection terminal 20s3 and a ground terminal to the conducting state or the non-conducting state.

The first, second, and third switches are series switches that are respectively connected in series between the common terminal 20c and the first, second, and third selection terminals 20s1, 20s2, and 20s3.

With the above-described configuration of the switch circuit 20, when, for example, connecting the common terminal 20c and the first selection terminal 20s1 with each other, that is, when the first signal path 23M in the non-CA mode is selected, the FET 201M is switched to the conducting state, while the FET 202M is switched to the non-conducting state. The FETs 201B and 201H are switched to the non-conducting state. In this state, as viewed from the common terminal 20c, the second and third signal paths 23H and 23B are in the open state. With this configuration, the isolation between the common terminal 20c and each of the second and third selection terminals 20s2 and 20s3 is maintained at a predetermined level. When connecting the common terminal 20c and the second selection terminal 20s2 or the third selection terminal 20s3 with each other, the conducting state and the non-conducting state of the FETs are able to be set in a manner similar to those described above.

Figure 3B:
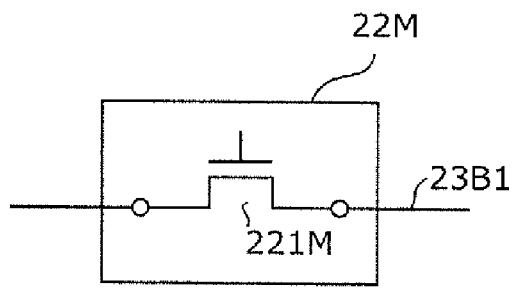
FIG. 3B is a circuit diagram illustrating the configuration of a CA switch circuit.

FIG. 3B is a circuit diagram illustrating the configuration of the CA switch circuit 22M. As shown in FIG. 3B, the CA switch circuit 22M is defined by a FET 221M. In the FET 221M, the state between the source and the drain is switched to the conducting state or the non-conducting state according to a control signal supplied to the gate. The CA switch circuit 22M is a fourth switch that is disposed in the first path 23B1 of the third signal path 23B to be selected in the CA mode and switches the connection state between the second end of the first path 23B1 and the first signal path 23M to the conducing state or the non-conducting state.

Figure 3C:
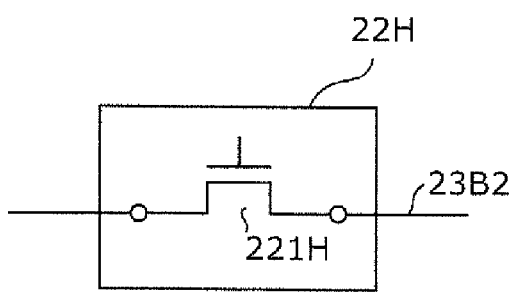
FIG. 3C is a circuit diagram illustrating the configuration of another CA switch circuit.

FIG. 3C is a circuit diagram illustrating the configuration of the CA switch circuit 22H. As shown in FIG. 3C, the CA switch circuit 22H is defined by a FET 221H. In the FET 221H, the state between the source and the drain is switched to the conducting state or the non-conducting state according to a control signal supplied to the gate. The CA switch circuit 22H is a fifth switch that is disposed in the second path 23B2 of the third signal path 23B to be selected in the CA mode and switches the connection state between the second end of the second path 23B2 and the second signal path 23H to the conducing state or the non-conducting state.

The variable adjuster 25 supplies this control signal to the gates of the FETs 221M and 221H so as to adjust the circuit states of the CA switch circuits 22M and 22H.

The transition of the circuit state of the switch module 10 configured as described above will be described below in detail.

Figure 4:
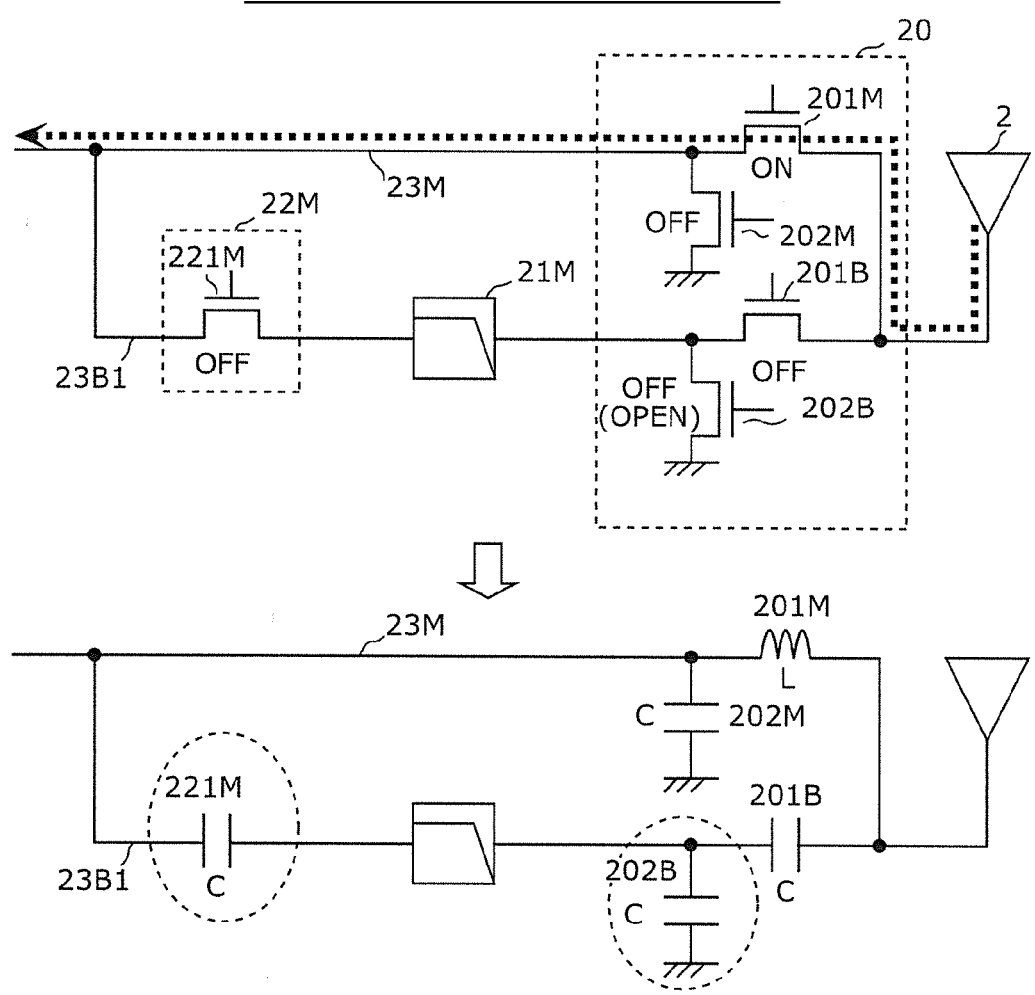
FIG. 4 is a circuit state diagram and an equivalent circuit diagram of the switch module when the non-CA mode (middle band) is selected.

FIG. 4 is a circuit state diagram and an equivalent circuit diagram of the switch module 10 when the non-CA mode (middle band) is selected. In the circuit shown in FIG. 4, the variable adjuster 25, the second path 23B2 of the third signal path 23B, and the second signal path 23H are not shown.

As shown in the upper section of FIG. 4, when the non-CA mode (middle band) is selected, the variable adjuster 25 (not shown) switches the FET 201M of the switch circuit 20 to the conducting state (ON) and switches the FET 202M to the non-conducting state (OFF). With this operation, the antenna device 2 and the first signal path 23M are connected. The variable adjuster 25 also switches the FETs 201B and 202B of the switch circuit 20 to the non-conducting state (OFF). With this operation, the antenna device 2 and the third signal path 23B are disconnected from each other. The variable adjuster 25 also switches the CA switch circuit 22M to the non-conducting state (OFF). With this operation, the first signal path 23M and the first path 23B1 of the third signal path 23B are disconnected from each other. The variable adjuster 25 also switches the FET 201H (not shown) to the non-conducting state (OFF). With this operation, the antenna device 2 and the second signal path 23H are disconnected from each other.

The lower section of FIG. 4 shows an equivalent circuit of the switch module 10 when the non-CA mode (middle band) is selected. Since the FETs 201B and 221M are in the non-conducting state, the first signal path 23M is disconnected from the third signal path 23B in terms of a direct current. In the equivalent circuit, however, the FETs 201B and 221M in the non-conducting state are considered as capacitors. Thus, in terms of a RF band, the first signal path 23M and the third signal path 23B are connected to each other via capacitors. In this case, the signal bandpass characteristic of the first frequency band in the first signal path 23M is influenced by the impedance of the third signal path 23B which is connected to the first signal path 23M via the FET 221M.

Figure 6A:
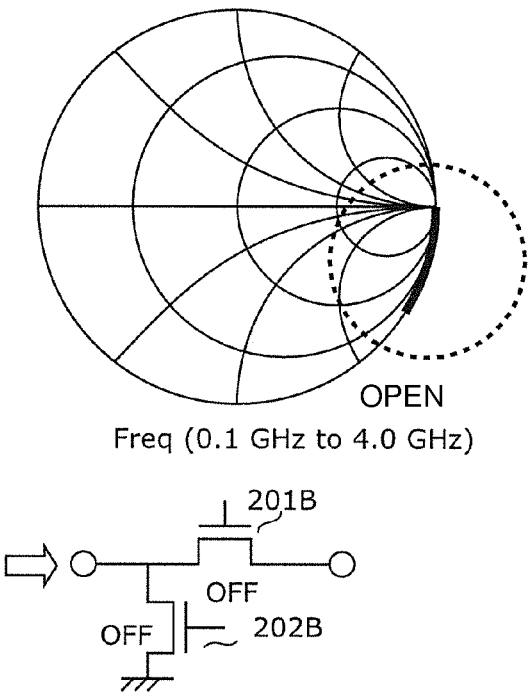
FIG. 6A is a Smith chart representing the state of impedance in a case in which a third signal path views a third selection terminal when the non-CA mode (middle band) is selected.

FIG. 6A is a Smith chart representing the state of impedance in a case in which the third signal path 23B views the third selection terminal 20s3 when the non-CA mode (middle band) is selected. When the non-CA mode (middle band) is selected, the FETs 201B and 202B are in the non-conducting state. Accordingly, as shown in FIG. 6A, the impedance of the third signal path 23B in the first frequency band when the third signal path 23B views the third selection terminal 20s3 is close to infinite (00), that is, in the open state.

Figure 7A:
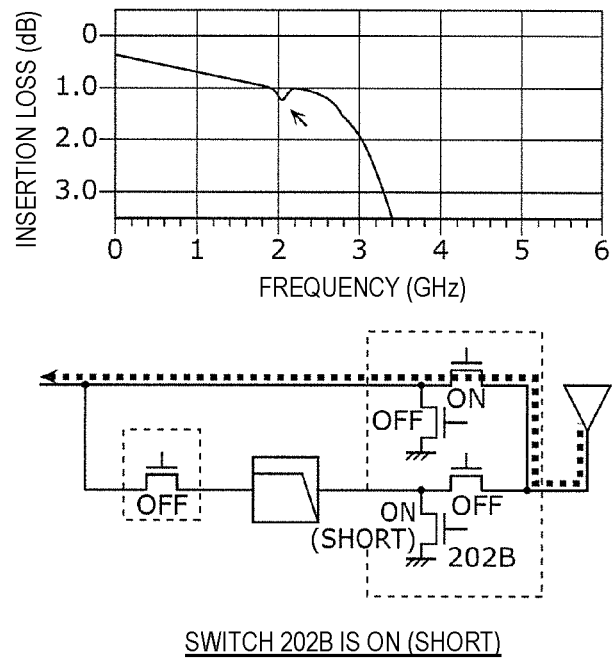
FIG. 7A is a graph illustrating the bandpass characteristic of a first signal path when the non-CA mode (middle band) is selected and when a third shunt switch is in the conducting state.
Figure 7B:
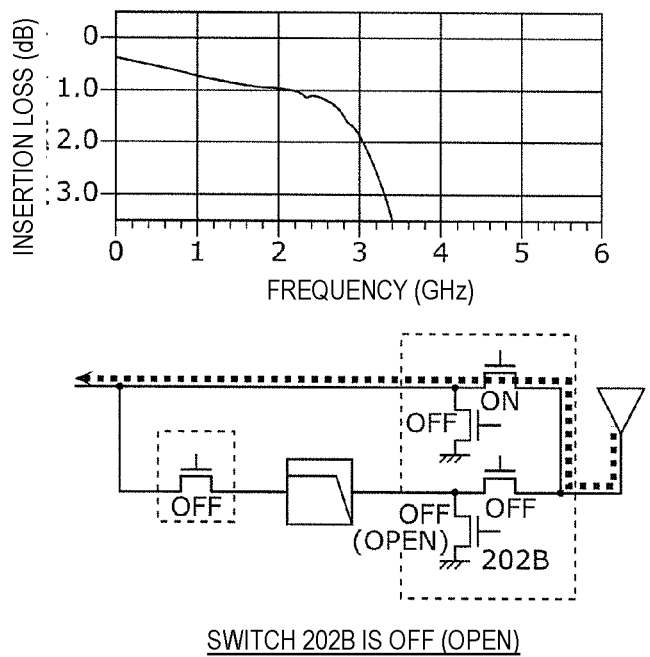
FIG. 7B is a graph illustrating the bandpass characteristic of the first signal path when the non-CA mode (middle band) is selected and when the third shunt switch is in the non-conducting state.

FIG. 7A is a graph illustrating the bandpass characteristic of the first signal path 23M when the non-CA mode (middle band) is selected and the FET 202B is in the conducting state. FIG. 7B is a graph illustrating the bandpass characteristic of the first signal path 23M when the non-CA mode (middle band) is selected and the FET 202B is in the non-conducting state. The vertical axis of each of the graphs of FIGS. 7A and 7B indicates the insertion loss in the first signal path 23M which extends from the connecting terminal between the antenna device 2 and the low pass filter 11 to the second end of the first signal path 23M.

When the FET 202B is in the conducting state as in FIG. 7A, a notch where the insertion loss is increased is observed in the first frequency band (around 2 GHz). In contrast, when the FET 202B is in the non-conducting state as in FIG. 7B, the notch observed in FIG. 7A has disappeared in the first frequency band (around 2 GHz). That is, when the non-CA mode (middle band) is selected, by setting the FET 202B to be in the non-conducting state, the bandpass characteristic of the first frequency band (middle band) in the first signal path 23M is able to be improved.

Figure 5:
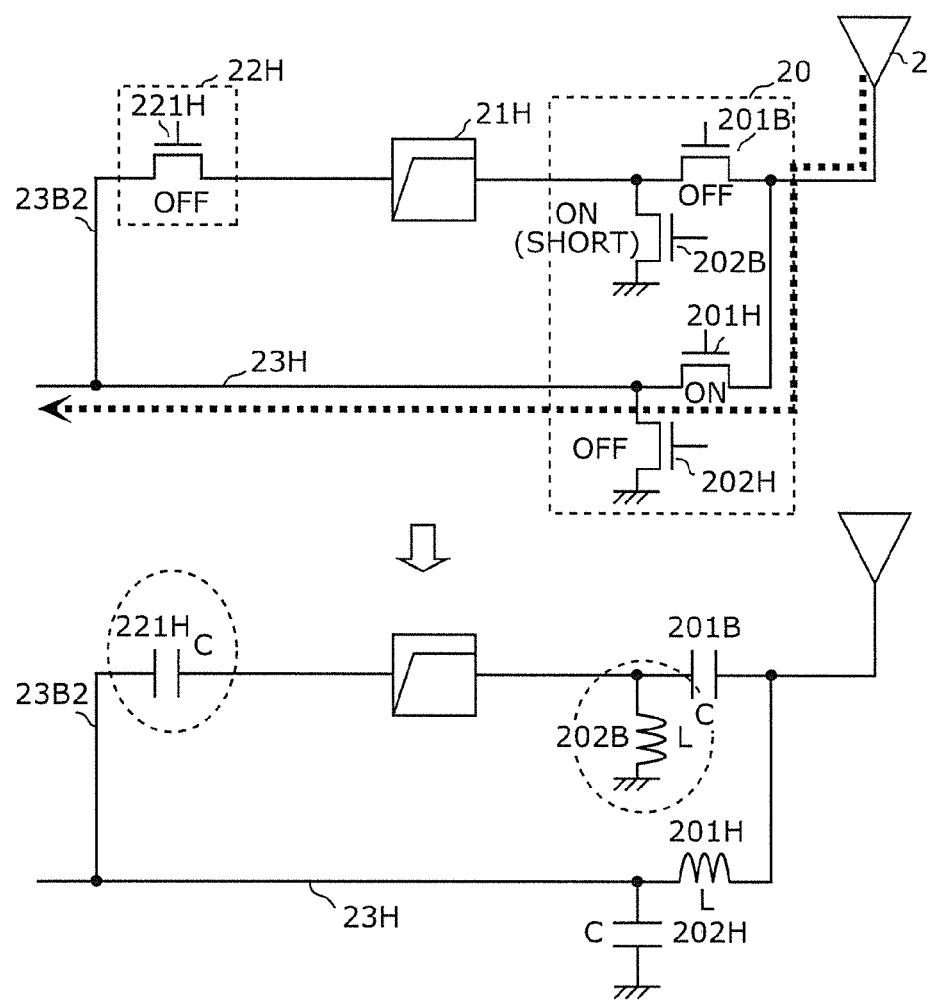
FIG. 5 is a circuit state diagram and an equivalent circuit diagram of the switch module when the non-CA mode (high band) is selected.

FIG. 5 is a circuit state diagram and an equivalent circuit diagram of the switch module 10 when the non-CA mode (high band) is selected. In the circuit shown in FIG. 5, the variable adjuster 25, the first path 23B1 of the third signal path 23B, and the first signal path 23M are not shown.

As shown in the upper section of FIG. 5, when the non-CA mode (high band) is selected, the variable adjuster 25 (not shown) switches the FET 201H of the switch circuit 20 to the conducting state (ON) and switches the FET 202H to the non-conducting state (OFF). With this operation, the antenna device 2 and the second signal path 23H are connected. The variable adjuster 25 also switches the FET 201B to the non-conducting state (OFF) and switches the FET 202B to the conducting state (ON). With this operation, the antenna device 2 and the third signal path 23B are disconnected from each other. The variable adjuster 25 also switches the CA switch circuit 22H to the non-conducting state (OFF). With this operation, the second signal path 23H and the second path 23B2 of the second signal path 23B are disconnected from each other. The variable adjuster 25 also switches the FET 201M (not shown) to the non-conducting state (OFF). With this operation, the antenna device 2 and the first signal path 23M are disconnected from each other.

The lower portion of FIG. 5 shows an equivalent circuit of the switch module 10 when the non-CA mode (high band) is selected. Since the FETs 201B and 221H are in the non-conducting state, the second signal path 23H is disconnected from the third signal path 23B in terms of a direct current. In the equivalent circuit, however, the FETs 201B and 221H in the non-conducting state are considered as capacitors. Thus, in a RF band, the second signal path 23H and the third signal path 23B are connected to each other via capacitors. In this case, the signal bandpass characteristic of the second frequency band in the second signal path 23H is influenced by the impedance of the third signal path 23B which is connected to the second signal path 23H via the FET 221H.

Figure 6B:
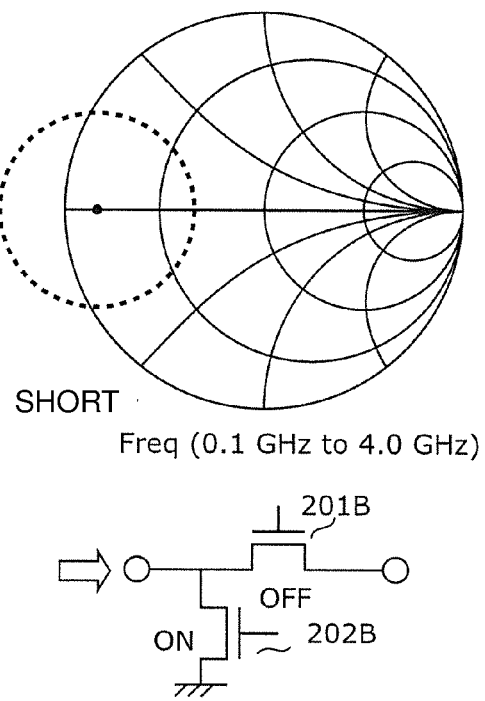
FIG. 6B is a Smith chart representing the state of impedance in a case in which the third signal path views the third selection terminal when the non-CA mode (high band) is selected.

FIG. 6B is a Smith chart representing the state of impedance in a case in which the third signal path 23B views the third selection terminal 20s3 when the non-CA mode (high band) is selected. When the non-CA mode (high band) is selected, the FET 201B is in the non-conducting state and the FET 202B is in the conducting state. Accordingly, as shown in FIG. 6B, the impedance of the third signal path 23B in the second frequency band when the third signal path 23B views the third selection terminal 20s3 is close to 0, that is, in the short state.

Figure 8A:
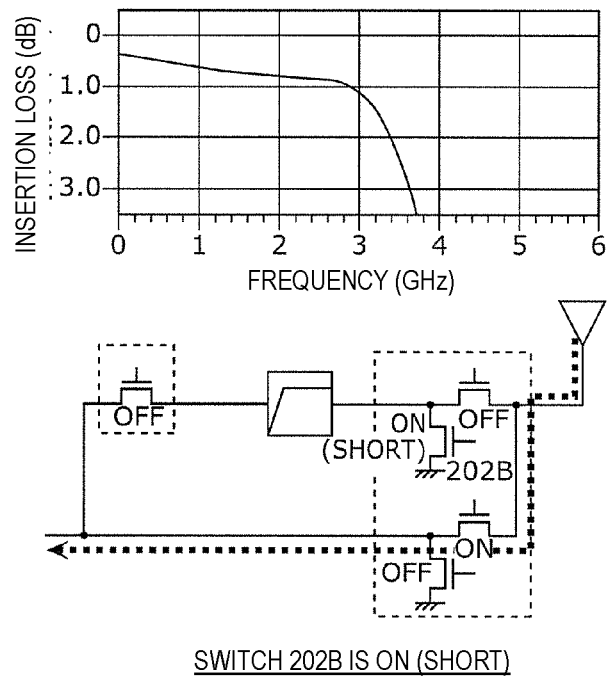
FIG. 8A is a graph illustrating the bandpass characteristic of a second signal path when the non-CA mode (high band) is selected and when the third shunt switch is in the conducting state.
Figure 8B:
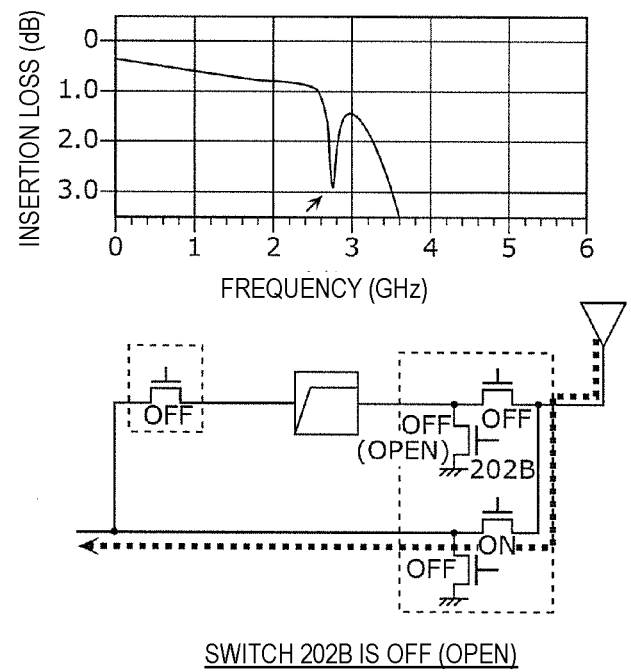
FIG. 8B is a graph illustrating the bandpass characteristic of the second signal path when the non-CA mode (high band) is selected and when the third shunt switch is in the non-conducting state.

FIG. 8A is a graph illustrating the bandpass characteristic of the second signal path 23H when the non-CA mode (high band) is selected and the FET 202B is in the conducting state. FIG. 8B is a graph illustrating the bandpass characteristic of the second signal path 23H when the non-CA mode (high band) is selected and the FET 202B is in the non-conducting state. The vertical axis of each of the graphs of FIGS. 8A and 8B indicates the insertion loss in the second signal path 23H which extends from the connecting terminal between the antenna device 2 and the low pass filter 11 to the second end of the second signal path 23H.

When the FET 202B is in the non-conducting state as in FIG. 8B, a notch where the insertion loss is increased is observed in the second frequency band (around 2.7 GHz). In contrast, when the FET 202B is in the conducting state as in FIG. 8A, the above-described notch is not observed in the second frequency band (around 2.7 GHz). That is, when the non-CA mode (high band) is selected, by setting the FET 202B to be in the conducting state, the bandpass characteristic of the second frequency band (high band) in the second signal path 23H are improved.

As is seen from the bandpass characteristic of the first frequency band in the first signal path 23M when the non-CA mode (middle band) is selected and from the bandpass characteristic of the second frequency band in the second signal path 23H when the non-CA mode (high band) is selected, the variable adjuster 25 sets the state of the FET 202B in the following manner. When the non-CA mode (middle band) is selected, the variable adjuster 25 switches the FET 202B connected to the first end of the third signal path 23B, which is not being selected, to be the non-conducing state. On the other hand, when the non-CA mode (high band) is selected, the variable adjuster 25 switches the FET 202B connected to the first end of the third signal path 23B, which is not being selected, to be the conducting state. That is, even for the use of the same non-CA mode, the variable adjuster 25 changes the circuit state of the third signal path 23B for the CA mode in accordance with the frequency band to be selected. More specifically, when the non-CA mode (middle band) is selected, the first end of the third signal path 23B is set to be in the open state. When the non-CA mode (high band) is selected, the first end of the third signal path 23B is set to be in the short state.

With this configuration, the impedance of the third signal path 23B, which is not being used, is able to be individually adjusted in accordance with the pass band of the signal path 23M or 23H which is being used. It is thus possible to enhance the isolation between the signal path 23M or 23H which is being used and the third signal path 23B and also to considerably reduce or prevent the occurrence of impedance mismatching in the first signal path 23M or the second signal path 23H which is being used for wireless communication.

In this preferred embodiment, the FET 221M which switches the connection state between the second end of the first path 23B1 and the first signal path 23M to the conducing state or the non-conducting state is disposed in the first path 23B1, and the FET 221H which switches the connection state between the second end of the second path 23B2 and the second signal path 23H to the conducing state or the non-conducting state is disposed in the second path 23B2. With this configuration, when the non-CA mode (middle band) is selected, the variable adjuster 25 switches the FET 221M to be the non-conducting state. When the non-CA mode (high band) is selected, the variable adjuster 25 switches the FET 221H to be the non-conducing state.

When the first frequency band in the non-CA mode is selected, the first path 23B1 of the third signal path 23B acts as a load for the first signal path 23M via the FET 221M which becomes capacitive. When the second frequency band in the non-CA mode is selected, the second path 23B2 of the third signal path 23B acts as a load for the second signal path 23H via the FET 221H which becomes capacitive. Even in this case, the impedance of the third signal path 23B, which is not being used but is still a load, is individually adjusted in accordance with the pass band of the selected frequency band. It is thus possible to enhance the isolation between the first signal path 23M or the second signal path 23H which is being used and the third signal path 23B and also to considerably reduce or prevent the occurrence of impedance mismatching in the first signal path 23M or the second signal path 23H which is being used for wireless communication.

In this preferred embodiment, the switch circuit 20 includes the FETs 202M, 202B, and 202H which respectively connect the first, second, and third selection terminals 20s1, 20s3, and 20s2 and a ground terminal. However, the components disposed between the first, second, and third selection terminals 20s1, 20s2, and 20s3 and a ground terminal are not restricted to FETs.

Figure 9:
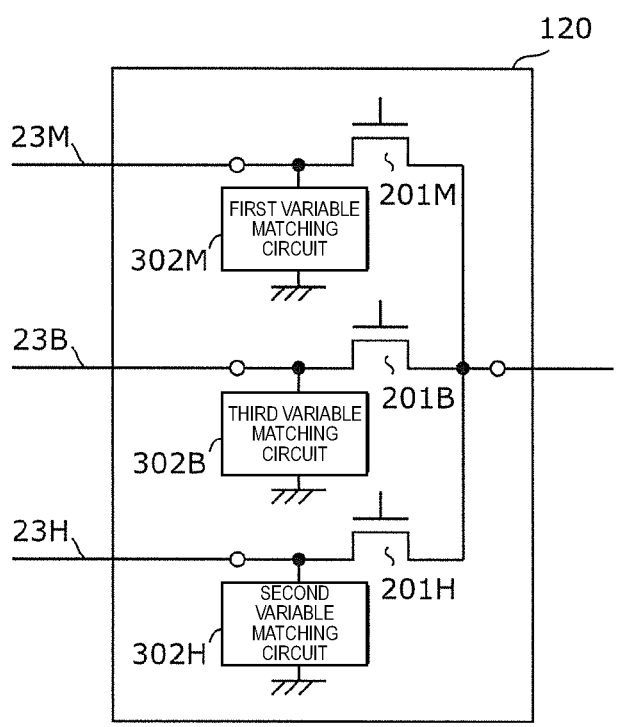
FIG. 9 is a circuit diagram illustrating a switch circuit according to a modified example of the above-described preferred embodiments of the present invention.

FIG. 9 is a circuit diagram illustrating a switch circuit 120 according to a modified example of the above-described preferred embodiment of the present invention. As shown in FIG. 9, variable matching circuits are disposed between the selection terminals and a ground terminal. The variable matching circuits adjust the impedance of the corresponding signal paths when the signal paths view the associated selection terminals. That is, as in the switch circuit 120, the switch circuit 20 may include a first variable matching circuit 302M disposed between the first selection terminal 20s1 and a ground terminal, a second variable matching circuit 302H disposed between the second selection terminal 20s2 and a ground terminal, and a third variable matching circuit 302B disposed between the third selection terminal 20s3 and a ground terminal. In this case, the switch circuit 120 is able to adjust the complex impedance of each of the signal path when the signal path views the associated selection terminal to more than two states (the open state and the short state). More specifically, the switch circuit 120 is able to adjust the complex impedance finely in a range between the open state and the short state.

That is, when the non-CA mode is selected, the variable adjuster 25 may variably adjust the third variable matching circuit 302B.

A switch module according to a preferred embodiment of the present invention may be used, not only to perform impedance matching when the non-CA mode is selected, but also to perform impedance matching when the CA mode is selected. That is, when the CA mode is selected, the variable adjuster 25 variably adjusts at least one of the first variable matching circuit 302M and the second variable matching circuit 302H. When the non-CA mode is selected, the variable adjuster 25 variably adjusts the third variable matching circuit 302B.

With this arrangement, in a configuration in which different signal paths are provided for the CA mode and the non-CA mode, such as in the switch module 10 of the above-described preferred embodiment, the variable adjuster 25 adjusts, not only the impedance of a signal path which is being used for wireless communication, but also the impedance of a signal path which is not being used for wireless communication. It is thus possible to enhance the isolation between a signal path which is being used for wireless communication and a signal path which is not being used for wireless communication, and also to considerably reduce or prevent the occurrence of impedance mismatching in a signal path which is being used for wireless communication.

The variable adjuster 25 may make the impedance of the third variable matching circuit 302B vary in accordance with whether the first frequency band or the second frequency band is selected in the non-CA mode.

With this arrangement, even for the use of the same non-CA mode, the variable adjuster 25 varies the impedance of the signal path for the CA mode in accordance with the frequency band to be selected in the non-CA mode. It is thus possible to highly precisely perform impedance matching, particularly in the non-CA mode, in accordance with the frequency band to be selected.

Other Preferred Embodiments

The switch modules and the driving methods therefor have been discussed through illustration of the preferred embodiments and the modified examples. However, the above-described switch modules and driving methods therefor are only examples. The elements in the above-described preferred embodiments and modified examples may be combined in any manner to realize other preferred embodiments, and various modifications apparent to those skilled in the art may be made to the preferred embodiments or the modified examples without departing from the scope and spirit of the present invention. Such preferred embodiments and modified examples are also encompassed within the present invention. Additionally, various devices integrating the switch module described above therein are also encompassed within the present invention.

For example, the front-end module 1 including the above-described switch module 10 and one of the duplexers 12M and 12H connected to the second ends of the first signal path 23M and the second signal path 23H, respectively, may be a preferred embodiment of the present invention.

The front-end module 1 may further include one of the power amplifiers 14M and 14H connected to the transmit terminals of the duplexers 12M and 12H, respectively.

The front-end module 1 may further include one of the low-noise amplifiers 13M and 13H connected to the receive terminals of the duplexers 12M and 12H, respectively.

With the configuration of the front-end module 1, it is possible to reduce the signal propagation loss in a system in which one of the CA mode and the non-CA mode is selectable.

In the above-described preferred embodiments, the variable adjuster 25 is a component of the switch module 10. Alternatively, instead of within the switch module 10, the variable adjuster 25 may be included in the front-end module 1. In this case, advantages obtained by the switch module 10 in the above-described preferred embodiments are achieved by the front-end module 1.

The variable adjuster 25 may be defined by an integrated circuit or a large scale integration (LSI) circuit, for example. The integrated technology of the variable adjuster 25 may be implemented by a dedicated circuit or a general-purpose processor, for example. For example, a field programmable gate array (FPGA) that may be configured by a customer or a designer after manufacturing or a reconfigurable processor that may reconfigure connections or settings of circuit cells within an LSI may be used. Further, due to the progress of semiconductor technologies or the appearance of a derivative technology, if a circuit integration technology which replaces a current semiconductor technology is developed, a functional block, such as the variable adjuster 25 may be integrated by utilizing such a technology.

In the switch module 10 and the front-end module 1 of the above-described preferred embodiments and modified examples, other RF circuit elements and wirings may be inserted on paths to connect the circuit elements and signal paths shown in the drawings.

Preferred embodiments of the present invention are widely applicable to communication devices, such as cellular phones, as a multiband- and multimode-support switch module including the CA system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switch module which is capable of selecting one of a carrier aggregation mode and a non-carrier-aggregation mode, the carrier aggregation mode being a mode in which a first frequency band for wireless communication and a second frequency band for wireless communication are used simultaneously, a frequency band of the second frequency band being different from a frequency band of the first frequency band, the non-carrier-aggregation mode being a mode in which only one of the first frequency band and the second frequency band is used, the switch module comprising:
    a first signal path that propagates a signal of the first frequency band therethrough;
    a second signal path that propagates a signal of the second frequency band therethrough;
    a third signal path that simultaneously propagates a signal of the first frequency band and a signal of the second frequency band therethrough; and
    a switch circuit including a common terminal connected to an antenna device, a first selection terminal connected to a first end of the first signal path, a second selection terminal connected to a first end of the second signal path, and a third selection terminal connected to a first end of the third signal path and that exclusively switches a connection between the common terminal and one of the first through third selection terminals; wherein
    the switch circuit includes:
        a first variable matching circuit disposed between the first selection terminal and a ground terminal;
        a second variable matching circuit disposed between the second selection terminal and a ground terminal; and
        a third variable matching circuit disposed between the third selection terminal and a ground terminal;
    the switch module further comprises:
        a variable adjuster that variably adjusts the third variable matching circuit in a case in which the non-carrier-aggregation mode is selected or that variably adjusts at least one of the first and second variable matching circuits in a case in which the carrier aggregation mode is selected.

2. The switch module according to claim 1, wherein the variable adjuster makes impedance of the third variable matching circuit vary according to whether the first frequency band or the second frequency band is selected in the non-carrier-aggregation mode.

3. The switch module according to claim 2, wherein the switch circuit further includes:
    a first switch that switches a state between the first selection terminal and the common terminal to a conducting state or a non-conducting state:
    a second switch that switches a state between the second selection terminal and the common terminal to a conducting state or a non-conducting state; and
    a third switch that switches a state between the third selection terminal and the common terminal to a conducting state or a non-conducting state;
    the third variable matching circuit includes a third shunt switch that switches a state between the third selection terminal and a ground terminal to a conducting state or a non-conducting state; and
    the variable adjuster switches the third shunt switch to a non-conducting state in a case in which the first frequency band in the non-carrier-aggregation mode is selected, and switches the third shunt switch to a conducting state in a case in which the second frequency band in the non-carrier-aggregation mode is selected.

4. The switch module according to claim 3, wherein the second frequency band is a frequency band in a higher frequency range than a frequency range of the first frequency band.

5. The switch module according to claim 1, wherein
    the third signal path includes a first path that selectively passes the first frequency band therethrough and a second path that selectively passes the second frequency band therethrough; and
    the first end of the third signal path is a node at which a first end of the first path and a first end of the second path are connected to each other; and
    the switch module further comprises:
        a fourth switch that switches a state between a second end of the first path and the first signal path to a conducting state or a non-conducting state; and a fifth switch that switches a state between a second end of the second path and the second signal path to a conducting state or a non-conducting state; wherein
the variable adjuster switches the fourth switch to a non-conducting state in a case in which the first frequency band in the non-carrier-aggregation mode is selected, and switches the fifth switch to a non-conducting state in a case in which the second frequency band in the non-carrier-aggregation mode is selected.

6. A front-end module comprising:
the switch module according to claim 1; and
a duplexer connected to a second end of the first signal path or a second end of the second signal path.

7. The front-end module according to claim 6, further comprising:
a power amplifier device connected to a transmit terminal of the duplexer.

8. The front-end module according to claim 6, further comprising:
a low-noise amplifier connected to a receive terminal of the duplexer.

9. The front-end module according to claim 6, wherein the variable adjuster makes impedance of the third variable matching circuit vary according to whether the first frequency band or the second frequency band is selected in the non-carrier-aggregation mode.

10. The front-end module according to claim 9, wherein the switch circuit further includes:
a first switch that switches a state between the first selection terminal and the common terminal to a conducting state or a non-conducting state:
a second switch that switches a state between the second selection terminal and the common terminal to a conducting state or a non-conducting state; and
a third switch that switches a state between the third selection terminal and the common terminal to a conducting state or a non-conducting state;
the third variable matching circuit includes a third shunt switch that switches a state between the third selection terminal and a ground terminal to a conducting state or a non-conducting state; and
the variable adjuster switches the third shunt switch to a non-conducting state in a case in which the first frequency band in the non-carrier-aggregation mode is selected, and switches the third shunt switch to a conducting state in a case in which the second frequency band in the non-carrier-aggregation mode is selected.

11. The front-end module according to claim 10, wherein the second frequency band is a frequency band in a higher frequency range than a frequency range of the first frequency band.

12. The front-end module according to claim 6, wherein the third signal path includes a first path that selectively passes the first frequency band therethrough and a second path that selectively passes the second frequency band therethrough; and
the first end of the third signal path is a node at which a first end of the first path and a first end of the second path are connected to each other; and
the switch module further comprises:
a fourth switch that switches a state between a second end of the first path and the first signal path to a conducting state or a non-conducting state; and
a fifth switch that switches a state between a second end of the second path and the second signal path to a conducting state or a non-conducting state; wherein
the variable adjuster switches the fourth switch to a non-conducting state in a case in which the first frequency band in the non-carrier-aggregation mode is selected, and switches the fifth switch to a non-conducting state in a case in which the second frequency band in the non-carrier-aggregation mode is selected.

13. A driving method for a switch module which selects one of a carrier aggregation mode and a non-carrier-aggregation mode, the carrier aggregation mode being a mode in which a first frequency band for wireless communication and a second frequency band for wireless communication are used simultaneously, a frequency band of the second frequency band being different from a frequency band of the first frequency band, the non-carrier-aggregation mode being a mode in which only one of the first frequency band and the second frequency band is used, the switch module including a first signal path that propagates a signal of the first frequency band therethrough, a second signal path that propagates a signal of the second frequency band therethrough, a third signal path that simultaneously propagates a signal of the first frequency band and a signal of the second frequency band therethrough, and a switch circuit including a common terminal connected to an antenna device, a first selection terminal connected to a first end of the first signal path, a second selection terminal connected to a first end of the second signal path, and a third selection terminal connected to a first end of the third signal path and that exclusively switches the connection between the common terminal and one of the first through third selection terminals, the switch circuit including a first variable matching circuit disposed between the first selection terminal and a ground terminal, a second variable matching circuit disposed between the second selection terminal and a ground terminal, and a third variable matching circuit disposed between the third selection terminal and a ground terminal, the driving method comprising:
variably adjusting the third variable matching circuit in a case in which the non-carrier-aggregation mode is selected or variably adjusting at least one of the first and second variable matching circuits in a case in which the carrier aggregation mode is selected.

14. The method according to claim 13, further comprising varying impedance of the third variable matching circuit according to whether the first frequency band or the second frequency band is selected in the non-carrier-aggregation mode.

15. The method according to claim 14, further comprising:
switching a state between the first selection terminal and the common terminal to a conducting state or a non-conducting state:
switching a state between the second selection terminal and the common terminal to a conducting state or a non-conducting state; and
switching a state between the third selection terminal and the common terminal to a conducting state or a non-conducting state; wherein
the third variable matching circuit includes a third shunt switch that switches a state between the third selection terminal and a ground terminal to a conducting state or a non-conducting state; and
the variable adjuster switches the third shunt switch to a non-conducting state in a case in which the first frequency band in the non-carrier-aggregation mode is selected, and switches the third shunt switch to a conducting state in a case in which the second frequency band in the non-carrier-aggregation mode is selected.

16. The method according to claim 15, wherein the second frequency band is a frequency band in a higher frequency range than a frequency range of the first frequency band.

17. The method according to claim 13, wherein the third signal path includes a first path that selectively passes the first frequency band therethrough and a second path that selectively passes the second frequency band therethrough; and the first end of the third signal path is a node at which a first end of the first path and a first end of the second path are connected to each other; and the switch module further comprises:

a fourth switch that switches a state between a second end of the first path and the first signal path to a conducting state or a non-conducting state; and a fifth switch that switches a state between a second end of the second path and the second signal path to a conducting state or a non-conducting state; wherein the variable adjuster switches the fourth switch to a non-conducting state in a case in which the first frequency band in the non-carrier-aggregation mode is selected, and switches the fifth switch to a non-conducting state in a case in which the second frequency band in the non-carrier-aggregation mode is selected.

* * * * *